US007737745B2

(12) United States Patent
You

(10) Patent No.: US 7,737,745 B2

(45) Date of Patent: Jun. 15, 2010

(54) DLL CLOCK SIGNAL GENERATING CIRCUIT CAPABLE OF CORRECTING A DISTORTED DUTY RATIO

(75) Inventor: Min-Young You, Ichon (KR)

(73) Assignee: Hynix Semiconductor Inc. (KR)

( * ) Notice: Subject to any disclaimer, the term of this patent is extended or adjusted under 35 U.S.C. 154(b) by 10 days.

(21) Appl. No.: 12/170,233

(22) Filed: Jul. 9, 2008

(65) Prior Publication Data

US 2009/0146706 A1 Jun. 11, 2009

(30) Foreign Application Priority Data

Dec. 11, 2007 (KR) ..................... 10-2007-0128297

(51) Int. Cl.
*H03L 7/06* (2006.01)

(52) U.S. Cl. ...................................... 327/158; 327/175

(58) Field of Classification Search ................ 327/175, 327/158

See application file for complete search history.

(56) References Cited

U.S. PATENT DOCUMENTS 6,822,494 B2 11/2004 Kim
6,853,226 B2 2/2005 Kwak et al.
6,943,602 B1 9/2005 Lee
6,963,235 B2 * 11/2005 Lee ........................... 327/158
7,525,364 B2 * 4/2009 Ariyoshi et al. ............ 327/276
7,548,101 B2 * 6/2009 Shim ......................... 327/175
2007/0069776 A1 * 3/2007 Hur ........................... 327/158
2007/0069781 A1 * 3/2007 Kim et al. .................. 327/158
2008/0042705 A1 * 2/2008 Kim et al. .................. 327/158
2008/0136476 A1 * 6/2008 Ku ............................ 327/158
2008/0201596 A1 * 8/2008 Cho .......................... 713/401
2008/0239846 A1 * 10/2008 Ku ............................ 365/194
2008/0272815 A1 * 11/2008 Yeo et al. .................. 327/175
2009/0058483 A1 * 3/2009 Shin et al. .................. 327/175
2009/0115459 A1 * 5/2009 Kwon et al. ................. 327/44
2009/0116315 A1 * 5/2009 Choi ......................... 365/194
2009/0146706 A1 * 6/2009 You .......................... 327/158
2009/0231006 A1 * 9/2009 Jang et al. .................. 327/175

FOREIGN PATENT DOCUMENTS

JP 2005-020686 1/2005
KR 1020030052650 A 6/2003
KR 1020070046341 A 5/2007
KR 1020080007796 1/2008
KR 1020080014457 2/2008

* cited by examiner

*Primary Examiner*—Lincoln Donovan
*Assistant Examiner*—Adam D Houston
(74) *Attorney, Agent, or Firm*—Baker & McKenzie LLP

(57) ABSTRACT

A DLL (Delay Locked Loop) clock signal generating circuit includes a duty correction buffer for receiving a first clock signal and a second clock signal, producing a first internal clock signal and a second internal clock signal, and correcting duty ratios of the first and second internal clock signals based on a reference signal which is controlled by a duty ratio of the first internal clock signal, and an edge trigger unit for a DLL clock signal which has a first level when the first internal clock signal is activated and which has a second level when the second internal clock signal is activated.

16 Claims, 5 Drawing Sheets

DLL CLOCK SIGNAL GENERATING CIRCUIT CAPABLE OF CORRECTING A DISTORTED DUTY RATIO

CROSS-REFERENCES TO RELATED APPLICATION

The present application claims priority under 35 U.S.C. 119(a) to Korean application number 10-2007-0128297, filed on Dec. 11, 2007, which is incorporated by reference in its entirety as if set forth in full.

BACKGROUND

1. Technical Field

The embodiments described herein relate to a semiconductor integrated circuit and, more particularly, to a DLL (Delay Locked Loop) clock signal generating circuit.

2. Related Art

Generally, in a conventional clock synchronization circuit, a clock signal is used as a reference signal to synchronize an internal circuit with an external circuit. Ideally, a conventional clock synchronization circuit can be employed to provide error free, high-speed operations. When a clock signal supplied from outside of a semiconductor integrated circuit is used internally by the semiconductor integrated circuit, a clock skew due to a signal path within the internal circuit can result. Clock synchronization circuits, such as a DLL circuit and a PLL (Phase Locked Loop) circuit, are employed to synchronize the internal clock signal with the external clock signal by compensating for this clock skew.

Meanwhile, it is important to maintain a 50%-duty ratio for the clock signal in a system in which high speed data input and output operations are conducted at both the rising edge and a falling edge of the clock signal, for example, at a DDR (Double Data Rate), in order to ensure a sufficient valid data window. In order to produce a clock signal having a 50%-duty ratio regardless of a duty ratio of the external clock signal or compensate for the change of the duty ratio, a conventional semiconductor integrated circuit will include a duty correction circuit (DCC) configured to work in concert with the, e.g., a DLL circuit.

For example, a feedback-type duty correction circuit can be provided to an output terminal of a clock buffer, or a duty correction circuit can be provided to an input terminal of the clock buffer.

FIG. 1 is a block diagram illustrating a conventional DLL clock signal generating circuit. In this example, a duty correction circuit 1 is disposed at an input terminal of a clock buffer 2. Referring to FIG. 1, the DLL clock signal generating circuit 4 also includes a DLL clock signal driver 3.

The duty correction unit 1 outputs a first reference signal ‘RVREF’ and a second reference signal ‘FVREF’ to correct the duty ratio of a first internal clock signal ‘RCLK1’ in response to a duty correction enable signal ‘DCC_EN’.

The clock buffer 2 receives a first clock signal ‘CLK’ and a second clock signal ‘CLKB’ and produces a first internal clock signal ‘RCLK1’ of which the duty ratio is corrected by the first and second reference signals ‘RVREF’ and ‘FVREF’.

The DLL clock signal driver 3 receives the first internal clock signal ‘RCLK1’ according to a power-down mode signal ‘PWDNB’, a command clock signal ‘BCK0’ and a reset signal ‘RESET’, and drives a various clock signals ‘CLKIN’, ‘REFCLK’ and ‘CONTCLK’.

The first internal clock signal ‘RCLK1’ is output as a DLL clock signal by correcting the duty ratio of the first clock signal ‘CLK’ and the second clock signal ‘CLKB’ supplied from an external circuit. However, when the duty cycle the first clock signal ‘CLK’ and the second clock signal ‘CLKB’ is off, then the DLL clock signal can be generated with a distorted duty ratio.

More specifically, since a transition time of both the first clock signal ‘CLK’ and the second clock signal ‘CLKB’, which is complementary to the first clock signal ‘CLK’, is out of the duty correction range, the duty ratio of the output signal ‘RCLK1’ of the clock buffer 2 is distorted.

As mentioned above, a duty correction unit 1 can be used to correct the distorted duty ratio. However, when the degree of distortion is beyond the critical value of the duty correction circuit, the first internal clock signal ‘RCLK1’ can still have a distorted duty ratio. Accordingly, during high frequency for a high-speed operation, a data valid window (tDV) can be reduced due to the distorted duty ratio of the DLL clock signals that result, which can lead to device failures.

SUMMARY

A DLL clock signal generating circuit capable of generating a DLL clock signal with a corrected duty ratio is described herein.

According to one aspect, a DLL (Delay Locked Loop) clock signal generating circuit comprises a duty correction buffer for receiving a first clock signal and a second clock signal, producing a first internal clock signal and a second internal clock signal, and correcting duty ratios of the first and second internal clock signals based on a reference signal controlled by a duty ratio of the first internal clock signal; and an edge trigger unit for a DLL clock signal that has a first level when the first internal clock signal is activated and a second level when the second internal clock signal is activated.

According to another aspect, an edge trigger unit for use in a DLL (Delay Locked Loop) comprises a first node, a pull-up unit configured to perform pull-up operation on the first node according to a first internal clock signal, a pull-down unit configured to perform a pull-down operation on the first node according to a second internal clock signal, and a latch unit coupled with the pull-up unit and the pull-down unit, the latch unit configured to latch a signal on the first node and output a DLL clock signal with a duty cycle corrected via the pull-up and pull-down operations.

According to still another embodiment, a method for correcting the duty cycle of an internal DLL clock signal comprises receiving a first and second input clock signal, the first and second clock signals being out of phase with each other, generating a first and second internal clock signal based on the transition timing of the first and second input clock signals, respectively, controlling the duty cycle of the first and second input clock signals, and thereby the first and second internal clock signals, based on the first internal clock signal, generating the internal DLL clock signal based on the transition timing of the first and second internal clock signals.

These and other features, aspects, and embodiments are described below in the section entitled “Detailed Description.”

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

According to the embodiments described herein, a duty corrected DLL clock signal can be produced based on an external clock signal. That is, when an internal clock signal is generated based on the external clock signal, the duty corrected DLL clock signal can be generated by producing a signal, synchronized with a rising edge of the external clock signal in order to have a duty ratio of the external clock signal, and producing another signal using a rising edge of the produced signal.

Figure 1:
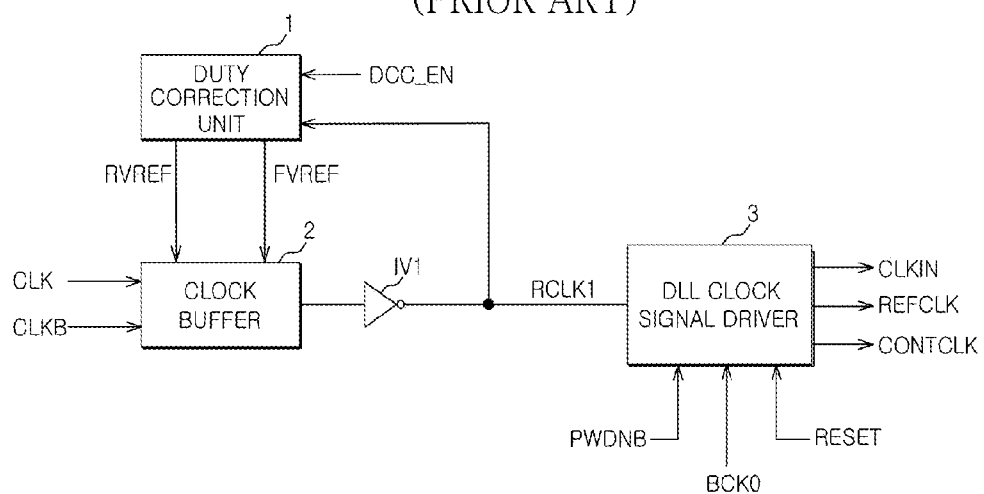
FIG. 1 is a block diagram illustrating a conventional DLL clock signal generating circuit.
Figure 2:
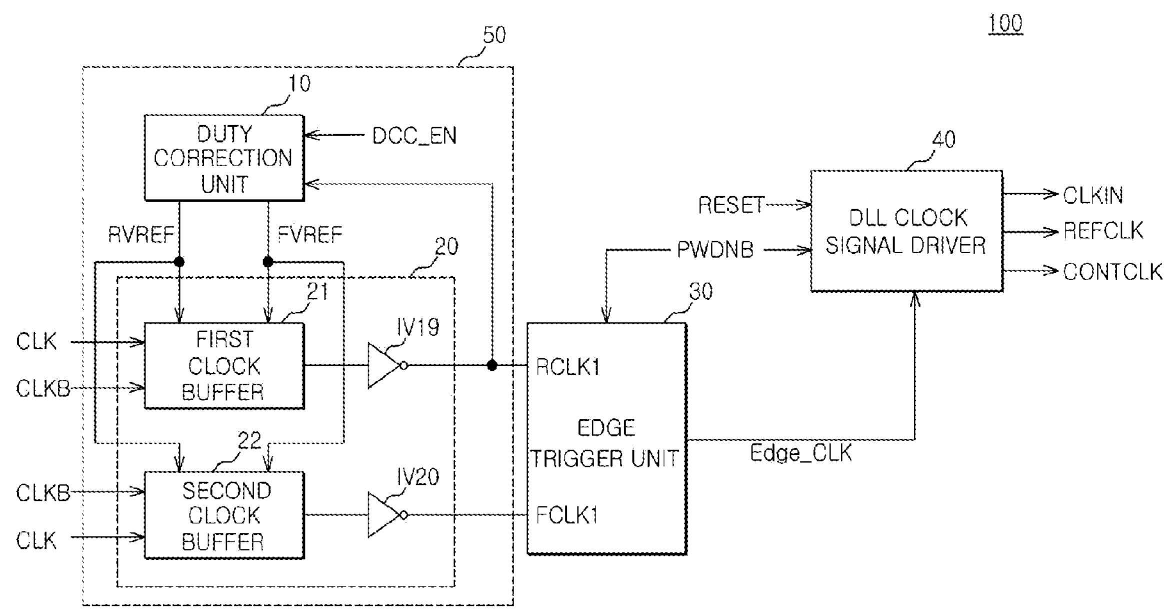
FIG. 2 is a block diagram illustrating a DLL clock signal generating circuit according to one embodiment.

FIG. 2 is a diagram illustrating a DLL clock signal generating circuit 100 configured in accordance with one embodiment. Referring to FIG. 2, the DLL clock signal generating circuit 100 includes a duty correction buffer 50, an edge trigger unit 30 and a DLL clock signal driver 40.

The duty correction buffer 50 can receive first and second clock signals 'CLK' and 'CLKB' and output first and second internal clock signals 'RCLK1' and 'FCLK1' of which the duty ratios are corrected according to first and second reference signals 'RVREF' and 'FVREF'. The first and second reference signals 'RVREF' and 'FVREF' are controlled based on the duty ratio of the first internal clock signal 'RCLK1'.

The duty correction buffer 50 can include a duty correction unit 10 and a clock buffer 20. The clock buffer 20 receives the first and second clock signals 'CLK' and 'CLKB' and provides the first and second internal clock signals 'RCLK1' and 'FCLK1', the duty ratio of which can be controlled by the first and second reference signals 'RVREF' and 'FVREF' as described below. Here, the first and second internal clock signals 'RCLK1' and 'FCLK1' are respectively produced in synchronization with rising edges of the first and second clock signals 'CLK' and 'CLKB', which are 180° out of phase with each other. It is assumed that the first and second clock signals 'CLK' and 'CLKB' are provided form an external circuit with a constant period.

The duty correction unit 10 can be configured to act in response to a duty correction enable signal 'DCC_EN', and can receive the first internal clock signal 'RCLK1' as a feedback signal and output the first and second reference signals 'RVREF' and 'FVREF'. The duty correction unit 10 can, e.g., be implemented as an analogue duty correction circuit.

More specifically, the duty correction unit 10 can receive the first internal clock signal 'RCLK1' and can detect a charge difference produced by a predetermined portion of the first internal clock signal 'RCLK1'. For example, the duty correction unit 10 can be configured to detect a charge difference when the internal clock signal 'RCLK1' is high.

The first and second reference signals 'RVREF' and 'FVREF' can then be output to correct the duty ratio of the first internal clock signal 'RCLK1' based on the detected charge difference.

The clock buffer 20 can include a first clock buffer 21 and a second clock buffer 22. Furthermore, the clock buffer 20 can include a nineteenth inverter IV19 for buffering an output signal of the first clock buffer 21 and a twentieth inverter IV20 for buffering an output signal of the second clock buffer 22.

Under the control of the first and second reference signals 'RVREF' and 'FVREF', the clock buffer 20 can correct the duty ratio of the first and second internal clock signals 'RCLK1' and 'FCLK1', by comparing the high level portion of the clock signals with the low level portion and active to increase or decrease on or the other if needed.

For example, the first clock buffer 21 can be configured to control the pulse widths of the high level portions of the received first and second clock signals 'CLK' and 'CLKB' in response to the first reference signal 'RVREF'. Furthermore, the first clock buffer 21 can control pulse widths of the low level portions of the received first and second clock signals 'CLK' and 'CLKB' in response to the second reference signal 'FVREF'. Accordingly, the first clock buffer 21 can provide the first internal clock signal 'RCLK1', of which the duty ratio is corrected, under the control of the first and second reference signals 'RVREF' and 'FVREF'.

Similar to the first clock buffer 21, the second clock buffer 22 can control pulse widths of the high and low level portions of the received first and second clock signals 'CLK' and 'CLKB' in response to the first and second reference signals 'RVREF' and 'FVREF', respectively. Accordingly, the second clock buffer 22 provide the second internal clock signal 'FCLK1', of which the duty ratio is corrected, under the control of the first and second reference signals 'RVREF' and 'FVREF'.

That is, collectively, the first and second clock buffers 21 and 22 can provide the first and second internal clock signals 'RCLK1' and 'FCLK1', of which the duty ratios are corrected, under the control of the first and second reference signals 'RVREF' and 'FVREF'.

However, when the duty ratio of the first and second clock signals 'CLK' and 'CLKB' is distorted beyond the duty correction range of the duty correction unit 10, then the first and second internal clock signals 'RCLK1' and 'FCLK1' can be produced in a state where the duty ratios are distorted.

Accordingly, the edge trigger unit 30 according to one embodiment, can be configured to produce a DLL clock signal 'Edge_CLK', of which the duty ratio is secondarily corrected, using rising edges of the first and second internal clock signals 'RCLK1' and 'FCLK1'.

In more detail, the edge trigger unit 30 can produce the DLL clock signal 'Edge_CLK', which is triggered and activated by the rising edge of the first internal clock signal 'RCLK1' and which is triggered and deactivated by the rising edge of the second internal clock signal 'FCLK1'.

In a power down mode, the edge trigger unit 30 can be configured produce the DLL clock signal 'Edge_CLK' at a constant low level. For example, when a power-down mode signal 'PWDNB' is at a high level and the semiconductor integrated circuit enters the power-down mode, the DLL clock signal 'Edge_CLK' can be deactivated to reduce current consumption (IDD).

The DLL clock signal driver 40 can produce a plurality of internal clock signals 'CLKIN', 'REFCLK' and 'CONTCLK' based on the DLL clock signal 'Edge_CLK', the power-down mode signal 'PWDNB', and a reset signal 'RESET'. Since the internal clock signals 'CLKIN', 'REFCLK' and 'CONTCLK' are produced based on the duty-corrected DLL clock signal 'Edge_CLK', the internal clock signals can be provided with corrected duty ratios.

Figure 3:
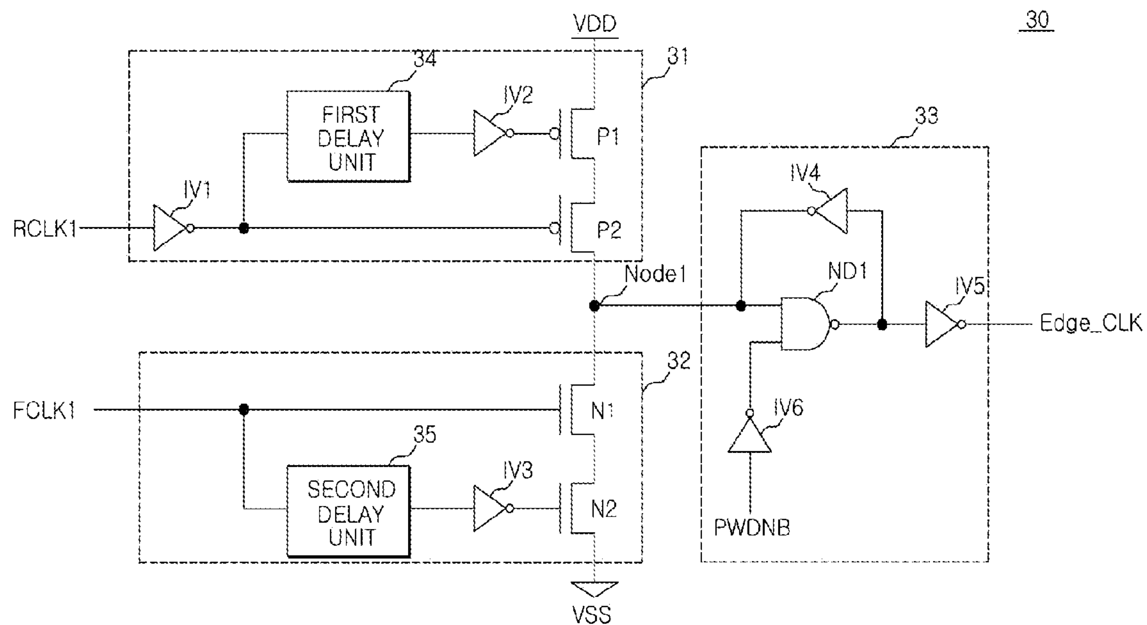
FIG. 3 is a detailed circuit diagram illustrating an edge trigger unit that can be included in the circuit of FIG. 2.

FIG. 3 is a detailed circuit diagram illustrating the edge trigger unit 30 of FIG. 2. Referring to FIG. 3, as mentioned above, the edge trigger unit 30 can produce the DLL clock signal 'Edge_CLK' in such a manner that the DLL clock signal 'Edge_CLK' maintains an active state, e.g., transitions to a high level in synchronization with the rising edge of the first internal clock signal 'RCLK1' and after a certain delay period therefrom, and then is deactivated, e.g., transitions to a low level in synchronization with the rising edge of the second internal clock signal 'FCLK1' and after a certain delay period therefrom.

The edge trigger unit 30 can include a pull-up unit 31, a pull-down unit 32, and a latch unit 33. The pull-up unit 31 can perform a pull-up operation on a first node Node1 according to the first internal clock signal 'RCLK1'. The pull-up unit 31 can include a first inverter IV1, a first delay unit 34, a second inverter IV2, a first PMOS transistor P1, and a second PMOS transistor P2.

The first inverter IV1 can receive the first internal clock signal 'RCLK1'. The first delay unit 34 can delay an output signal of the first inverter IV1 for a predetermined time. The second inverter IV2 can receive an output signal of the first delay unit 34. The first PMOS transistor P1 can have a gate to which an output signal of the second inverter IV2 is applied and a source to which a power supply voltage VDD is applied. The second PMOS transistor P2 can have a gate to which the output signal of the first inverter IV1 is applied, a source connected to a drain of the first PMOS transistor P1, and a drain connected to the first node Node1.

The pull-down unit 32 can perform a pull-down operation on the first node Node1 according to the second internal clock signal 'FCLK1'. The pull-down unit 32 can include a second delay unit 35, a third inverter IV3, a first NMOS transistor N1 and a second NMOS transistor N2.

The second delay unit 35 can delay the second internal clock signal 'FCLK1' for a predetermined time. The third inverter IV3 receives an output signal of the second delay unit 35. The first NMOS transistor N1 can have a gate to which the second internal clock signal 'FCLK1' is applied and a drain connected to the first node Node1. The second NMOS transistor N2 can have a gate to which an output signal of the third inverter IV3 is applied, a drain connected to a source of the first NMOS transistor N1, and a source to which a ground voltage VSS is applied.

The first delay time can be controlled by the number of delay elements of the first delay unit 34 and the second delay unit 35.

The latch unit 33 can latch an output signal of the first node Node1 and then produces the DLL clock signal 'Edge_CLK'. More specifically, the latch unit 33 includes fourth to sixth inverters IV4 to IV6 and a first NAND gate ND1. The sixth inverter IV6 can receive the power-down mode signal "PWDNB". The first NAND gate ND1 can receive an output signal of the sixth inverter IV6 and a signal supplied from the first node Node1. The fourth inverter IV4 can receive an output signal of the first NAND gate ND1 and then supply it to the first node Node1. The first inverter IV5 can receive the output signal of the first NAND gate ND1 and then produces the DLL clock signal 'Edge_CLK'. Further, the latch unit 33 can be configured to provide the DLL clock signal 'Edge_CLK' at a low level when an activated power-down mode signal 'PWDNB' is received.

The detailed operation of the edge trigger unit 30 will now be described. When the second internal clock signal 'FCLK1' is in at high level, the first NMOS transistor N1 is turned on. After a predetermined time set by the second delay unit 35 and the third inverter IV3 has elapsed, then the second NMOS transistor N2 is turned on. When both NMOS transistors N1 and N2 are turned on, the voltage of the first node Node1 will be pulled to a low level via NMOS transistors N1 and N2

Assuming the power down mode signal "PWDB" is at a level, i.e., deactivated, then the latch unit 33 will output the DLL clock signal 'Edge_CLK' at a low level.

When the first internal clock signal 'RCLK1' transitions to a high level, then the output signal of the first inverter IV1 goes to a low level and turns second PMOS transistor P2 on. After a delay set by the first delay unit 34 and the second inverter IV2, the first PMOS transistor P1 is turned on.

Accordingly, after the first internal clock signal 'RCLK1' transitions to a high level, the voltage on the first node Node1 will be pulled high through by PMOS transistors P1 and P2. The latch unit 33 will then output the DLL clock signal 'Edge_CLK' at a high level.

That is, the pull-up unit 31 and pull-down unit 32 operate in synchronization with the rising edges of the first and second internal clock signals 'RCLK1' and 'FCLK1', respectively. Since the edge trigger unit 30 is triggered by (or synchronized with) the rising edges of the first internal clock signal 'RCLK1' and the second internal clock signal 'FCLK1', it is not influenced by the pulse widths and the duty ratios of the first internal clock signal 'RCLK1' and the second internal clock signal 'FCLK1'. Accordingly, the duty ratio of the DLL clock signal 'Edge_CLK' can be corrected using the rising time of the first internal clock signal 'RCLK1' and the second internal clock signal 'FCLK1'.

As mentioned above, the first and second internal clock signals 'RCLK1' and 'FCLK1' are produced in synchronization with the rising edges of the first and second clock signals 'CLK' and 'CLKB' and the 180° phase difference is maintained between the first and second clock signals 'CLK' and 'CLKB'. Therefore, although the duty ratios of the first and second internal clock signals 'RCLK1' and 'FCLK1' may be distorted, the phase difference between the rising edges of the first and second clock signals 'CLK' and 'CLKB' can still be maintained. Therefore, if the DLL clock signal 'Edge_CLK' is produced using the rising edges of the first and second internal clock signals 'RCLK1' and 'FCLK1', then the DLL clock signal 'Edge_CLK' can have the same duty ratio as the rising edges of the first and second clock signals 'CLK' and 'CLKB'.

It should be noted that, the edge trigger 30 can be implemented by, but not limited to, a mixer.

Figure 4:
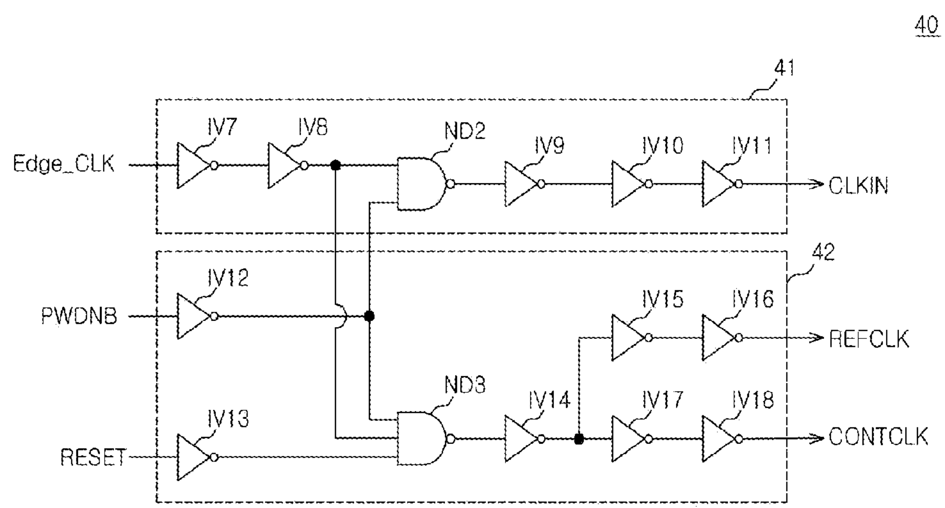
FIG. 4 is a detailed circuit diagram illustrating a DLL clock signal driver that can be included in the circuit of FIG. 2.

Referring to FIG. 4, the DLL clock signal driver 40 can include a first clock signal driver 41 and a second clock signal driver 42. The first clock signal driver 41 can receive the DLL clock signal 'Edge_CLK' and the power-down mode signal 'PWDNB' and then produces a first DLL clock signal 'CLKIN' based thereon. The first clock signal driver 41 can include seventh to eleventh inverters IV7 to IV11 and a second NAND gate ND2.

When the power-down mode signal 'PWDNB' is activated, the first clock signal driver 41 can deactivate the first DLL clock signal 'CLKIN' and, when the power-down mode signal PWDNB is deactivated, the first clock signal driver 41 can produce the duty-corrected first DLL clock signal 'CLKIN', which has the same clock period as the DLL clock signal 'Edge_CLK'.

In more detail, when the power-down mode signal 'PWDNB' is at a high level, an output signal of the second NAND gate ND2 is also at a high level and the first DLL clock signal 'CLKIN' is at a low level. When the power-down mode signal 'PWDNB' is at a low level, the output signal of the second NAND gate ND2 is an inverted signal formed by inverting an output signal of the eighth inverter IV8. Accordingly, the first DLL clock signal 'CLKIN' has the same duty ratio and voltage level as the DLL clock signal 'Edge_CLK'.

The second clock signal driver 42 can receive the DLL clock signal 'Edge_CLK', the power-down mode signal 'PWDNB' and a reset signal 'RESET' and then produces a second DLL clock signal 'REFCLK' and a third DLL clock signal 'CONTCLK' based thereon. The second clock signal driver 42 can include twelfth to eighteenth inverters IV12 to IV18 and a third NAND gate ND3.

When the power-down mode signal 'PWDNB' or a reset mode signal is activated, the second clock signal driver 42 can deactivate the second and third DLL clock signals 'REFCLK' and 'CONTCLK' and, when the power-down mode signal 'PWDNB' and the reset mode signal are deactivated, the second clock signal driver 42 can produce the duty-corrected second and third DLL clock signals 'REFCLK' and 'CONTCLK', which have the same clock period as the DLL clock signal 'Edge_CLK'.

When the power-down mode signal 'PWDNB' is at a high level, the second and third DLL clock signals 'REFCLK' and 'CONTCLK' have the same level as the first DLL clock signal 'CLKIN' because the second clock signal driver 42 operates in the same manner as the first clock signal driver 41. That is, the second and third DLL clock signals 'REFCLK' and 'CONTCLK' are at a low level. Furthermore, when the reset signal 'RESET' is in a high level, the second and third DLL clock signals 'REFCLK' and 'CONTCLK' are at a low level. When the power-down mode signal 'PWDNB' and the reset signal 'RESET' are at a low level, the second and third DLL clock signals 'REFCLK' and 'CONTCLK' have the same duty ratio and voltage level as the DLL clock signal 'Edge_CLK'.

In the above embodiments, three internal DLL clock signals and two clock signal drivers are exemplarily illustrated for convenience in illustration; however, the number of internal DLL clock signals and clock signal drivers can be more or less depending on the requirements of a specific implementation.

Figure 5:
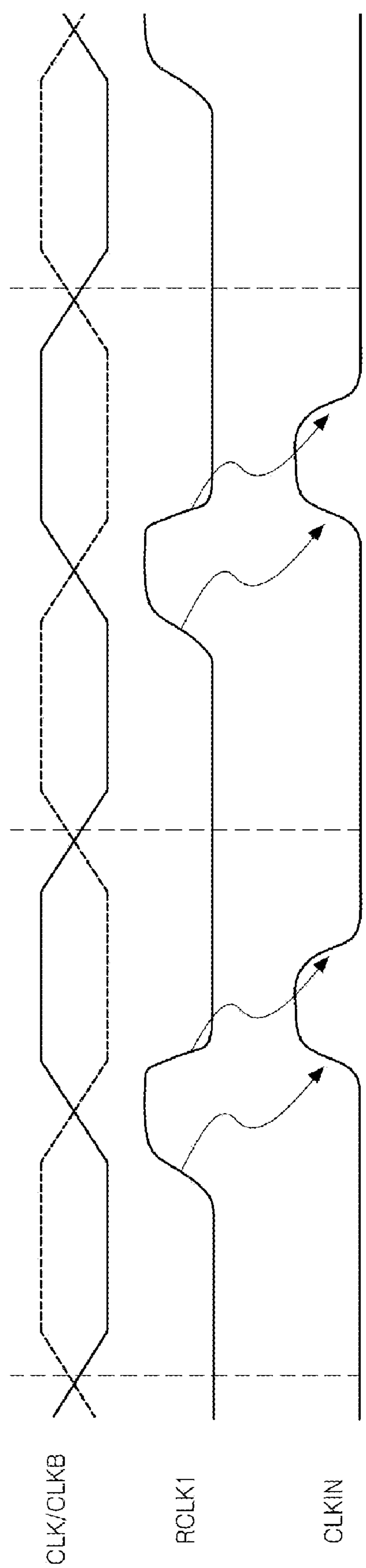
FIG. 5 is a timing chart illustrating the operation of the DLL clock signal generating unit of FIG. 1.

FIG. 5 is a timing chart illustrating the operation of a conventional clock signal generating circuit. Referring to FIG. 5, a first internal clock signal 'RCLK1' is output by a clock buffer. FIG. 5 shows a case where the duty ratio of the first internal clock signal 'RCLK1' is out of the duty correction range of a duty correction circuit because of an abnormal operation of the clock buffer. Accordingly, the duty ratio is not corrected by the duty correction circuit, so that the clock period of the first internal clock signal 'RCLK1', is reflected on a DLL clock signal 'CLKIN'.

Figure 6:
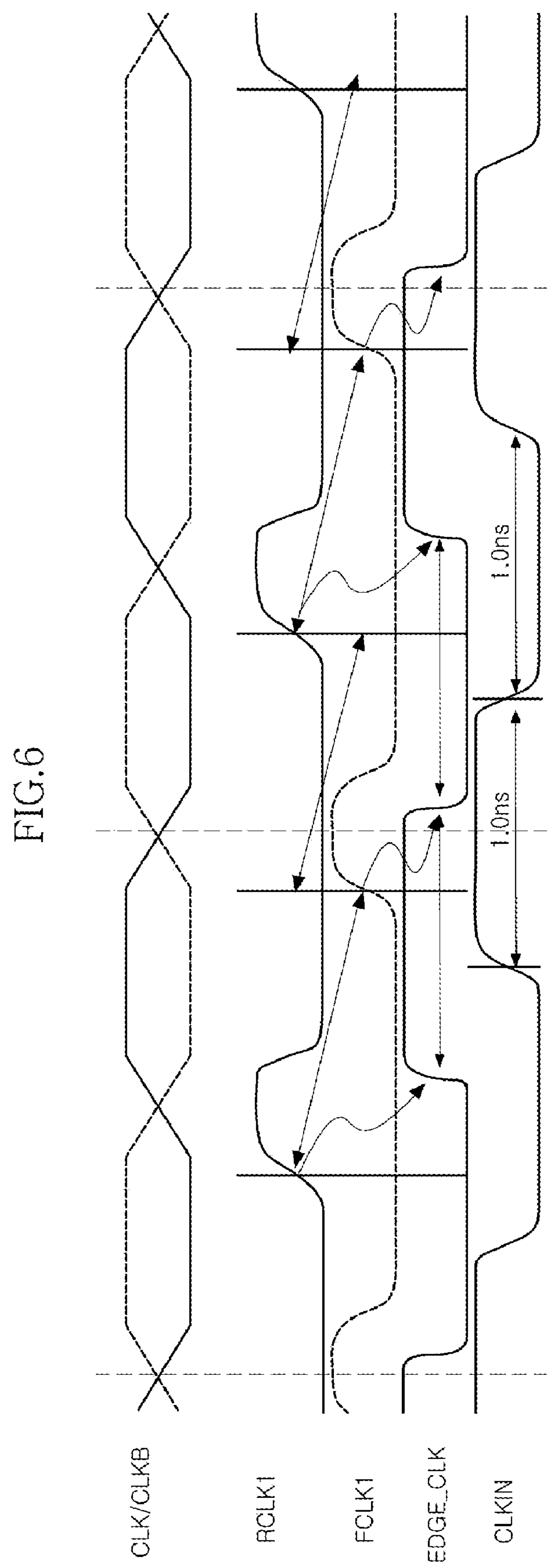
FIG. 6 is a timing chart illustrating the operation of the DLL clock signal generating circuit of FIG. 2.

FIG. 6 is a timing chart illustrating the operation of the DLL clock signal generating circuit 100. Referring to FIGS. 2 to 4 and FIG. 6, the first and second internal clock signals 'RCLK1' and 'FCLK1' supplied from the clock buffer 20 are in the duty ratio of 20 to 80, respectively. However, as described above, the duty ratio of the DLL clock signal 'Edge_CLK', which is provided by the edge trigger unit 30, is 50-50. That is, since the DLL clock signal 'Edge_CLK' is produced using the rising edges of the first and second internal clock signals 'RCLK1' and 'FCLK1', the DLL clock signal 'Edge_CLK' can be provided as a clock signal on which the duty ratio of the first and second clock signals 'CLK' and 'CLKB' are reflected. The first DLL clock signal 'CLKIN' can then be generated based on the DLL clock signal 'Edge_CLK' by the DLL clock signal driver 40. In this example, the high and low level sections of the first DLL clock signal 'CLKIN is 1 ns with the 50% duty ratio.

Figure 7:
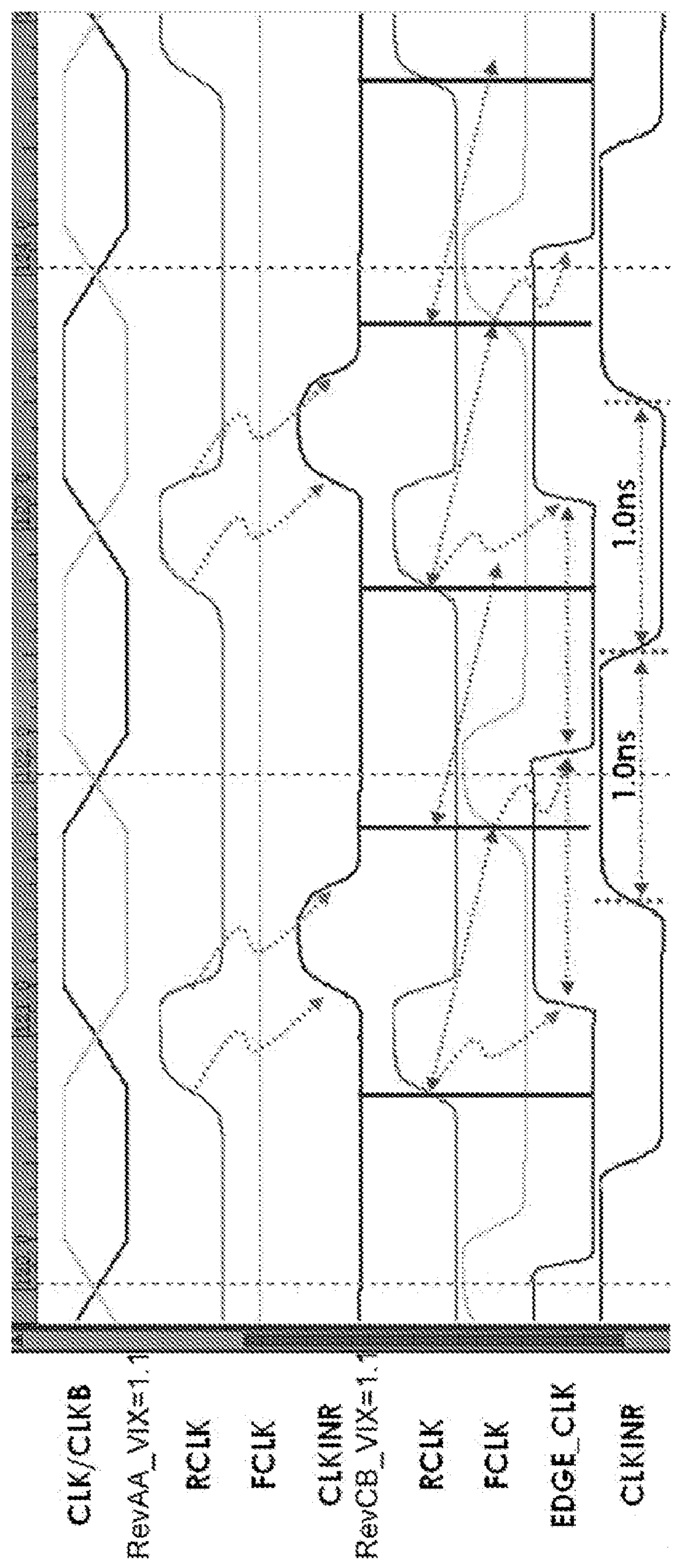
FIG. 7 is a timing chart comparing the operating of the DLL clock signal generating circuit of FIGS. 1 and 2.

FIG. 7 is a timing chart comparing the operation of a conventional DLL clock signal generating circuit with the DLL clock signal generating unit 100.

The first clock signal CLK and the second clock signal 'CLKB' are input with the 50% duty ratio. First data (RevAA_VIX=1.1) designate a first internal clock signal 'RCLK', a second internal clock signal 'FCLK' and a DLL clock signal 'CLKINR' according to the conventional DLL clock signal generating circuit. In the case that the first internal clock signal 'RCLK' is in the duty ratio of 20:80, the DLL clock signal 'CLKINR' is also in the duty ratio of 20:80 with no duty correction.

Second data (RevCB_VIX=1.1) designate the first and second internal clock signals 'RCLK' and 'FCLK' of the DLL clock signal generating circuit and the DLL clock signal 'CLKINR' of the DLL clock signal driver 40. Although the first and second internal clock signals 'RCLK' and 'FCLK' are in the duty ratios of 20:80, the output signal of the edge trigger unit 30 is in the duty ratio of 50:50 and the output signal 'CLKINR' of the DLL clock signal driver 40 is also in the duty ratio of 50:50.

As apparent from the above, even if a signal has a distorted duty cycle that is out of the duty correction range of the duty correction circuit, the DLL clock signal generating circuit can still correct the duty ratio of the signal, which makes it possible to increase the valid data window and to reduce data failure in high frequency operation.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A DLL (Delay Locked Loop) clock signal generating circuit comprising:

a duty correction buffer configured to receive a first clock signal and a second clock signal, produce a first internal clock signal and a second internal clock signal, and correct duty ratios of the first and second internal clock signals based on a reference signal produced based on a duty ratio of the first internal clock signal; and an edge trigger unit coupled with the duty cycle correction buffer, the edge trigger unit configured to produce a DLL clock signal that transitions to a first level when the first internal clock signal is activated and that transitions to a second level when the second internal clock signal is activated.

2. The DLL clock signal generating circuit of claim 1, wherein the duty correction buffer includes:

a duty correction unit configured to receive the first internal clock signal and output first and second reference signals as the reference signal in response to a duty correction enable signal; and a clock buffer coupled with the duty correction circuit, the clock buffer configured to buffer the first and second clock signals and producing the first and second internal clock signals with duty ratios according to the first and second reference signals.

3. The DLL clock signal generating circuit of claim 1, wherein the edge trigger unit is further configured to control a duty ratio of the DLL clock signal based on a phase difference between a rising time of the first internal clock signal and a rising time of the second internal clock signal.

4. The DLL clock signal generating circuit of claim 1, wherein the edge trigger unit is further configured to control a duty ratio of the DLL clock signal based on a phase difference between a falling time of the first internal clock signal and a falling time of the second internal clock signal.

5. The DLL clock signal generating circuit of claim 1, wherein the edge trigger unit is further configured to transition the level of the DLL clock signal to a first level a predetermined time after the first internal clock signal transitions to an active level, and to transition the DLL clock signal to a second level a predetermined time after the second internal clock signal transitions to an active level.

6. The DLL clock signal generating circuit of claim 1, wherein the edge trigger unit includes:

a pull-up unit for performing a pull-up operation on a first node according to the first internal clock signal;

a pull-down unit for performing a pull-down operation on the first node according to the second internal clock signal; and a latch unit for latching a signal on the first node and outputting the DLL clock signal.

7. The DLL clock signal generating circuit of claim 6, wherein the pull-up unit is configured to perform the pull-up operation on the first node a predetermined time after the first internal clock signal transitions to an active level.

8. The DLL clock signal generating circuit of claim 7, wherein the pull-down unit is configured to perform the pull-down operation on the first node a predetermined time after the second internal clock signal transitions to the an active level.

9. The DLL clock signal generating circuit of claim 6, wherein latch unit is configured to deactivate the DLL clock signal when a power-down mode signal is activated and maintain a voltage level on the first node when the power-down mode signal is deactivated.

10. The DLL clock signal generating circuit of claim 2, wherein the clock buffer includes:

a first clock buffer configured to correct a duty ratio of the first internal clock signal by receiving the first and second clock signals according to the first and second reference signals; and a second clock buffer configured to correct a duty ratio of the second internal clock signal by receiving the first and second clock signals according to the first and second reference signals.

11. The DLL clock signal generating circuit of claim 10, wherein the clock buffer is further configured to output the first and second internal clock signals, and wherein a phase difference between the first and second internal clock signals is the same as that between the first and second clock signals.

12. The DLL clock signal generating circuit of claim 1, further comprising a DLL clock signal driver coupled with the edge trigger unit, the DLL clock signal driver configured to receive the DLL clock signal and produce a clock signal.

13. The DLL clock signal generating circuit of claim 1, wherein the edge trigger comprises a mixer.

14. A method for correcting the duty cycle of an internal DLL clock signal, comprising:

receiving a first and second input clock signal, the first and second clock signals being out of phase with each other;

generating a first and second internal clock signal based on the transition timing of the first and second input clock signals, respectively;

controlling the duty cycle of the first and second input clock signals, and thereby the first and second internal clock signals, based on the first internal clock signal;

generating the internal DLL clock signal based on the transition timing of the first and second internal clock signals.

15. The method of claim 14, wherein generating the internal DLL clock signal further comprises transitioning the internal DLL clock signal to a high level based on the transition timing of the first internal clock signal, and transitioning the internal DLL clock signal to a second level based on the transition timing of the second internal lock signal.

16. The method of claim 15, wherein generating the internal DLL clock signal further comprises delaying the transition of the first internal clock signal a predetermined time and then transitioning the internal DLL clock signal to a high level based on the transition of the first internal clock signal, and delaying the transition of the second internal clock signal a predetermined time and then transitioning the internal DLL clock signal to a second level based on the transition timing of the second internal lock signal.

* * * * *